(12) United States Patent
Li et al.

(10) Patent No.: US 9,006,956 B2
(45) Date of Patent: Apr. 14, 2015

(54) PIEZOELECTRIC ACTIVE COOLING DEVICE

(75) Inventors: Qing Li, Boulder, CO (US); Jon J. Anderson, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 491 days.

(21) Appl. No.: 13/467,297

(22) Filed: May 9, 2012

(65) Prior Publication Data

US 2013/0301218 A1  Nov. 14, 2013

(51) Int. Cl.
| | | |
|---|---|---|
| H01L 41/09 | (2006.01) | |
| F04D 33/00 | (2006.01) | |
| G06F 1/20 | (2006.01) | |
| H01L 23/467 | (2006.01) | |
| H01L 41/04 | (2006.01) | |

(52) U.S. Cl.
CPC ............. F04D 33/00 (2013.01); G06F 1/203 (2013.01); G06F 1/206 (2013.01); H01L 23/467 (2013.01); H01L 41/042 (2013.01); H01L 41/0933 (2013.01); H01L 41/094 (2013.01); *H01L 2924/0002* (2013.01); *Y02B 60/1275* (2013.01)

(58) Field of Classification Search
CPC ....... H01L 41/08; H01H 97/00; G10K 11/004
USPC ............ 310/311, 315, 316.01, 317, 318, 328, 310/330, 331, 341, 346
See application file for complete search history.

(56) References Cited

U.S. PATENT DOCUMENTS

| | | | |
|---|---|---|---|
| 5,861,703 A * | 1/1999 | Losinski ........................ 310/330 |
| 7,397,164 B1 | 7/2008 | Ali | |
| 7,742,299 B2 | 6/2010 | Sauciuc et al. | |
| 8,076,822 B2 | 12/2011 | Ohsawa | |
| 2002/0175596 A1 | 11/2002 | Garimella et al. | |
| 2004/0207292 A1* | 10/2004 | Scher et al. .................... 310/328 |
| 2005/0231914 A1 | 10/2005 | Mikubo et al. | |

(Continued)

FOREIGN PATENT DOCUMENTS

| | | | | |
|---|---|---|---|---|
| JP | 3-252157 | * | 11/1991 | ............. H01L 23/36 |
| JP | 2000323882 A | | 11/2000 | |

(Continued)

OTHER PUBLICATIONS desc.trans.JP2000323882, Nov. 2000, Japan, Junichi.*

(Continued)

*Primary Examiner* — Thomas Dougherty
(74) *Attorney, Agent, or Firm* — Todd E. Marlette

(57) ABSTRACT

Methods, systems, and devices for providing cooling for a mobile device using piezoelectric active cooling devices. Some embodiments utilize piezoelectric actuators that oscillate a planar element within an air channel to fan air within or at an outlet of the air channel. The air channel may be defined by at least one heat dissipation surface in thermal contact with components of the mobile device that generate excess waste heat. For example, the air channel may include a surface that is in thermal contact with a processor of the mobile computing device. In embodiments, the piezoelectric active cooling device may be used in an air gap between stacked packages in a package on package (PoP) processor package. The described embodiments provide active cooling using low power, can be controlled to provide variable cooling, use highly reliable elements, and can be implemented at low cost.

23 Claims, 13 Drawing Sheets

(56) References Cited

U.S. PATENT DOCUMENTS

| | | |
|---|---|---|
| 2007/0242427 A1 | 10/2007 | Yamamoto et al. |
| 2009/0050299 A1 | 2/2009 | Staley |
| 2010/0067191 A1 | 3/2010 | Arik et al. |
| 2011/0005733 A1* | 1/2011 | Wada et al. ............ 165/121 |
| 2011/0014069 A1 | 1/2011 | Wada et al. |
| 2012/0301333 A1* | 11/2012 | Smirnov ............ 417/413.2 |

FOREIGN PATENT DOCUMENTS

| | | |
|---|---|---|
| JP | 2002134975 A | 5/2002 |
| JP | 2005026473 A | 1/2005 |

OTHER PUBLICATIONS desc.trans.JP2005024229, Jan. 2005, Japan, Nakada et al.*

Huang, et al., "Experimental and Numerical Investigations on Dynamic Characteristics for Piezoceramic Bimorphs," 5th Australasian Congress on Applied Mechanics, ACAM 2007, Dec. 10-12, 2007, Brisbane, Australia, 6 pages.

International Search Report and Written Opinion—PCT/US2013/040443—ISA/EPO—Aug. 8, 2013.

* cited by examiner

PIEZOELECTRIC ACTIVE COOLING DEVICE

BACKGROUND

As mobile computing devices become more integrated and include more computing power, they may generate more heat. For example, a modern smartphone may include one or more highly integrated components known as a system on a chip ("SoC") or a system in package ("SiP"). Each SoC or SiP may have one or more integrated circuits ("ICs") with one or more processor cores, memory circuits, graphics processing circuits, radio frequency communication circuits, and other digital and analog circuits. Further, multiple SoCs or SiPs may be stacked in a package on package ("PoP") configuration. A common PoP configuration includes one SoC or SiP package that has processing and other circuits, with a second stacked package that includes volatile and/or non-volatile memory components.

These highly integrated processing components may generate a large amount of heat within a tightly integrated packaging structure. Additionally, many manufacturers desire to increase the number of processing cores and processor clock speeds, further increasing the amount of heat generated in the package. For mobile computing device processors especially, heat may become a limiting factor to computing performance.

Typically, mobile computing devices may include passive heat dissipation components (e.g., heat sinks, etc.) that transfer heat from the processor package and/or other components that require heat dissipation to an exterior surface of the mobile computing device. However, the overall ability to dissipate heat from the mobile computing device may be limited by the thermal conduction paths between the exterior surfaces of the mobile computing device and the environment (e.g., air or other medium in contact with the exterior surface). As power consumption of mobile processors continues to increase, passive heat dissipation techniques may no longer be able to keep up with the heat generated by the mobile computing device. While there are known techniques for active cooling such as cooling fans, these techniques may be difficult to integrate into the limited enclosure space of mobile computing devices.

SUMMARY

Methods, systems, and devices are described for providing active cooling for a mobile computing device using piezoelectric cooling devices. The described embodiments provide active cooling using low power, can be controlled to provide variable cooling, use highly reliable elements, and can be implemented at low cost. Some embodiments utilize piezoelectric actuators that oscillate a planar element within an air channel to fan air within or at an outlet of the air channel. The air channel may be defined by at least one heat dissipation surface in thermal contact with components of the mobile device that generate excess waste heat. For example, the air channel may include a surface that is in thermal contact with a processor of the mobile computing device. In embodiments, the piezoelectric active cooling device may be used in an air gap between stacked packages in a package on package (PoP) processor package. In embodiments, the piezoelectric actuator is actuated at a frequency lower than a user can typically hear.

In some embodiments, a piezoelectric actuator is a piezoelectric bimorph actuator. The piezoelectric bimorph actuator may be fixed at one end or in the middle, with at least one free end that oscillates on actuation of the piezoelectric bimorph actuator. The free end of the piezoelectric bimorph actuator may be attached to a planar element that may be oscillated by the piezoelectric bimorph actuator. The planar element may be fan shaped, with the free end having a semi-circular shape and/or having a greater width than the end that is attached to the piezoelectric bimorph actuator. The piezoelectric bimorph actuator may be driven in a series or parallel configuration with an AC drive signal such as a sine wave signal.

In some embodiments, the piezoelectric actuator is used to set up a traveling wave in a planar element. The traveling wave may push air through an air channel to set up an air flow generally between an inlet to the air channel and an outlet of the air channel. The planar element may be a resilient material such as spring steel, carbon fiber, plastic, and/or other material. The piezoelectric actuator may be piezoelectric bimorph that is fixed at one end and coupled to the planar element at a second end. The planar element may be free to vibrate at the other end, fixed, fixed in position but free to rotate, and/or coupled by a spring to the mobile computing device and/or air channel.

Some embodiments include a mobile device that includes an air channel defined by at least a first heat dissipation surface, a planar element disposed at least partially within the air channel, and a piezoelectric actuator configured to oscillate the planar element to cause air to move within the air channel. In some embodiments, the piezoelectric actuator and the planar element include a piezoelectric bimorph actuator. The mobile device may include a first semiconductor package having a top surface that comprises the first heat dissipation surface and a second semiconductor package having a bottom surface that comprises a second heat dissipation surface of the air channel, the second semiconductor package in a package on package (PoP) configuration with the first semiconductor package;

In some embodiments, the air channel includes an air inlet port on a housing of the mobile device and an air outlet port on the housing of the mobile device. Some embodiments include an air outlet of the air channel, where the planar element fans air away from the first heat dissipation surface at the air outlet of the air channel. Some embodiments include an air inlet having upper and lower surfaces that are substantially coplanar with the planar element and joined with the air channel at a side of the air channel adjacent to a lateral edge of the planar element. The planar element may include a first end coupled to the piezoelectric actuator and a second arcuately shaped free end.

In some embodiments, the planar element is coupled to the piezoelectric actuator at a first end and actuation of the piezoelectric actuator causes a transverse wave in the planar element that travels from the first end to a second distal end of the planar element. The piezoelectric actuator may include a piezoelectric bimorph where a first end of the piezoelectric bimorph is fixedly attached to the mobile device and a second end of the piezoelectric bimorph is coupled to the first end of the planar element. A spring element may be coupled to the second end of the planar element that springedly attaches the second end of the planar element to the mobile device. Alternatively, a weight may be coupled to the second end of the planar element and/or the second end of the planar element may be fixedly and/or rotationally attached to the mobile device.

In some embodiments, the piezoelectric actuator includes a piezoelectric bimorph actuator, where a center portion of the piezoelectric bimorph actuator is fixed to the mobile device and end portions of the piezoelectric bimorph actuator are free to move on actuation of the piezoelectric bimorph actuator. The piezoelectric bimorph actuator may include a plurality of piezoelectric bimorph segments coupled end to end to form a strip, wherein a first end of the strip and a second distal end of the strip are coupled to the mobile device. The plurality of piezoelectric bimorph segments may be driven with a plurality of substantially sinusoidal drive waveforms.

In some embodiments, the mobile device includes a temperature sensor and a temperature controller coupled to the temperature sensor and the piezoelectric actuator, where the temperature controller controls the piezoelectric actuator to oscillate the planar element based on a measured temperature of the temperature sensor and a temperature threshold. The temperature controller may vary the amplitude of a drive signal to the piezoelectric actuator based on a measured temperature. The air channel may include a first portion having a first dimension and a second portion that tapers from the first dimension to a second larger dimension at an outlet port of the air channel. The air channel may include a first portion having a first dimension and a second portion that is arcuately shaped between the first dimension and a second larger dimension at an outlet port of the air channel. The second portion may be arcuately shaped to substantially match an extent of the planar element when oscillated.

Some embodiments include a method for cooling a mobile device. The method may include: disposing an air channel defined by at least a first heat dissipation surface within the mobile device; disposing a planar element at least partially within the air channel; coupling a piezoelectric actuator to the planar element; and/or controlling the piezoelectric actuator to oscillate the planar element to cause air to move within the air channel. The method may include measuring a temperature of the mobile device and controlling the piezoelectric actuator based on the measured temperature. The piezoelectric actuator may be coupled to a first end of the planar element and controlling the piezoelectric actuator may include setting up a transverse wave in the planar element that travels from the first end of the planar element to a second distal end of the planar element.

In some embodiments, a method for cooling a mobile device includes: receiving temperature information, the temperature information indicating temperature within the mobile device; comparing the temperature information against a temperature threshold; and/or controlling, responsive to the comparing, a piezoelectric actuator to oscillate a planar element to cause air to move within the mobile device. The piezoelectric actuator and/or the planar element may include a piezoelectric bimorph actuator. The temperature information may indicate a temperature of a processor of the mobile device. The temperature information may indicate a temperature of an air channel within the mobile device. The controlling may include controlling an amplitude of a drive voltage to the piezoelectric actuator based on the comparing of the temperature information against the temperature threshold. The temperature threshold may include a plurality of temperature thresholds and the comparing may include determining a control set-point of the piezoelectric actuator based on the plurality of temperature thresholds.

In some embodiments, the planar element is coupled to the piezoelectric actuator at a first end and controlling of the piezoelectric actuator includes generating a transverse wave in the planar element that travels from the first end to a second distal end of the planar element. The piezoelectric actuator may include a piezoelectric bimorph where a first end of the piezoelectric bimorph may be fixedly attached to the mobile device and a second end of the piezoelectric bimorph may be coupled to the first end of the planar element. The second end of the planar element may be coupled to a spring element that springedly attaches the second end of the planar element to the mobile device. The second end of the planar element may be coupled to a weight. The second end of the planar element may be fixedly or rotationally attached to the mobile device.

In some embodiments, the piezoelectric actuator includes a piezoelectric bimorph actuator, where a center portion of the piezoelectric bimorph actuator is fixed to the mobile device and end portions of the piezoelectric bimorph actuator are free to move on actuation of the piezoelectric bimorph actuator. In some embodiments, the piezoelectric actuator includes a plurality of piezoelectric bimorph segments coupled end to end to form a strip, where a first end of the strip and a second distal end of the strip are coupled to the mobile device. Controlling the piezoelectric actuator may include driving the plurality of piezoelectric bimorph segments with a plurality of drive waveforms, where each drive waveform includes an alternating voltage waveform having a phase offset from a drive waveform for an adjoining piezoelectric bimorph segment.

In some embodiments, a mobile device includes: means for receiving temperature information that indicates temperature within the mobile device; means for comparing the temperature information against a temperature threshold; and/or means for controlling, responsive to the comparing, a piezoelectric actuator to oscillate a planar element to move air within the mobile device. In some embodiments, a mobile device includes at least one processor. In embodiments, the processor is configured to: receive temperature information, the temperature information indicating temperature within the mobile device; compare the temperature information against a temperature threshold; and control, responsive to the comparison, a piezoelectric actuator to oscillate a planar element to move air within the mobile device.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Figure 1A:
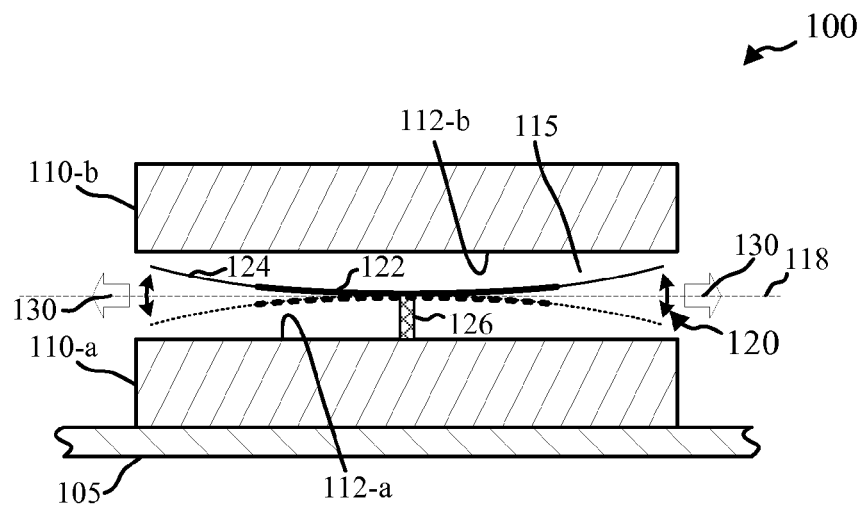
FIG. 1A shows a side view of a stacked semiconductor package employing a piezoelectric active cooling device, according to various embodiments.

Described embodiments are directed to providing active cooling for a mobile computing device using piezoelectric cooling devices. Some embodiments utilize piezoelectric actuators that oscillate a planar element within an air channel to fan air within or at an outlet of the air channel. The air channel may be defined by at least one heat dissipation surface in thermal contact with components of the mobile device that generate excess waste heat. For example, the air channel may include a surface that is thermally coupled with a processor of the mobile computing device. In embodiments, the piezoelectric active cooling device may be used in an air gap between stacked packages in a package on package (PoP) processor package. In embodiments, the piezoelectric actuator is actuated at a frequency lower than a user can typically hear. The described embodiments provide active cooling using low power, can be controlled to provide variable cooling, use highly reliable elements, and can be implemented at low cost.

In some embodiments, the piezoelectric actuator of the active cooling device is a piezoelectric bimorph actuator. The piezoelectric bimorph actuator may be fixed at one end or in the middle, with at least one free end that oscillates on actuation of the piezoelectric bimorph actuator. The free end of the piezoelectric bimorph actuator may be attached to a planar element that may be oscillated by the piezoelectric bimorph actuator. The planar element may be fan shaped, with the free end having a semi-circular shape and/or having a greater width than the end that is attached to the piezoelectric bimorph actuator. The piezoelectric bimorph actuator may be driven in a series or parallel configuration with an AC drive signal such as a sine wave voltage signal.

In some embodiments, the piezoelectric actuator is used to set up a transverse traveling wave in a planar element. The traveling wave may push air through an air channel to set up an air flow generally within the air channel from an air inlet port to an outlet port of the air channel. The planar element may be a flexible and resilient material such as spring steel, carbon fiber, plastic, and/or other material. The piezoelectric actuator may be a piezoelectric bimorph that is fixed at one end and coupled to the planar element at a second end. The planar element may be free to vibrate at the other end, weighted, fixed, fixed in position but free to rotate, and/or coupled by a spring to the mobile computing device and/or air channel.

This description provides examples, and is not intended to limit the scope, applicability or configuration of the invention. Rather, the ensuing description will provide those skilled in the art with an enabling description for implementing embodiments of the invention. Various changes may be made in the function and arrangement of elements without departing from the spirit and scope of the disclosure.

Various embodiments may omit, substitute, or add various procedures or components as appropriate. For instance, it should be appreciated that the methods may be performed in an order different than that described, and that various steps may be added, omitted or combined. Also, aspects and elements described with respect to certain embodiments may be combined in various other embodiments. It should also be appreciated that the following systems, methods, devices, and software may individually or collectively be components of a larger system, wherein other procedures may take precedence over or otherwise modify their application.

Figure 1B:
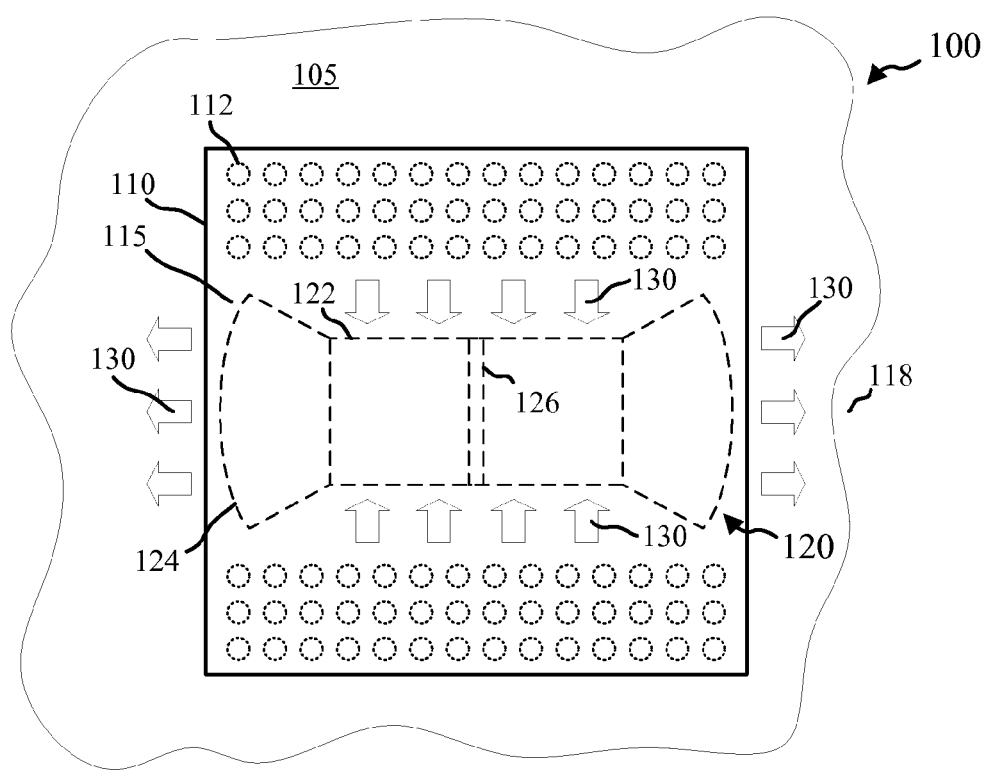
FIG. 1B shows a top view of a stacked semiconductor package employing a piezoelectric active cooling device, according to various embodiments.

FIG. 1A and FIG. 1B show a stacked semiconductor package 100 (e.g., PoP, and the like) that employ a piezoelectric active cooling device 120, according to various embodiments. FIG. 1A illustrates a side view of the stacked package 100 mounted to a circuit board 105 with piezoelectric cooling device 120 employed within an air channel 115 defined by an upper surface 112-a of a first package 110-a and a lower surface 112-b of a second package 110-b. The upper surface 112-a and/or lower surface 112-b of the air channel 115 may be in thermal contact with processors or other components of the stacked package 100 that generate excess waste heat. For example, the stacked packages 110-a and 110-b may be made of a ceramic or other material that is thermally conductive to transfer waste heat from the integrated circuits in the packages to the heat dissipation surfaces 112-a and 112-b of the packages.

Active cooling of stacked semiconductor package 100 may provide several performance advantages including increasing processing capabilities and/or reducing power consumption of components of stacked semiconductor package 100. For example, the performance of a processor component of stacked semiconductor package 100 may be thermally limited without active cooling. In this instance, the clock frequency and/or the number of processor operations may be controlled below the maximum capabilities of the processor to maintain thermal performance. Active cooling using piezoelectric active cooling device 120 may allow the frequency and/or number of processor operations to be increased without exceeding the thermal limit of the processor. Active cooling using piezoelectric active cooling device 120 may also be used to lower the operating temperature of the processor and/or other components (e.g., memory, etc.) of the stacked semiconductor package 100. Lower operating temperature may reduce off-state leakage current of the components of stacked semiconductor package 100, which may be a significant component of overall power consumption of stacked semiconductor package 100. The power saved due to reduced off-state leakage current of components of stacked semiconductor package 100 may be greater than the power required to operate piezoelectric active cooling device 120.

The piezoelectric active cooling device 120 illustrated in FIG. 1A may be called a fan-type piezoelectric active cooling device because oscillation of the free ends of the piezoelectric cooling device 120 within the air channel 115 causes air movement 130 away from the oscillating ends of the piezoelectric cooling device 120. The piezoelectric cooling device 120 may include a piezoelectric element 122, where at least a portion of the piezoelectric element 122 is fixed relative to the package 100 and at least a portion of the piezoelectric element 122 is free to vibrate as the piezoelectric element 122 is actuated. In embodiments, piezoelectric element 122 is fixed within the air channel in a middle portion or an end portion, with at least one end freely vibrating. In the example shown in FIG. 1A, piezoelectric element 122 is fixed in the middle by one or more supports 126, with either end of the piezoelectric element 122 freely vibrating.

FIG. 1B illustrates a top view of stacked package 100. As can be seen in FIG. 1B, the top and bottom packages 110 of stacked package 100 may be connected through an interconnect technology such as a ball grid array or pin grid array 112. While not illustrated in FIGS. 1A and 1B, the bottom package 110-a may be connected to circuit board 105 through a similar interconnect technology. FIG. 1B illustrates that as air is forced away from the vibrating or oscillating ends of piezoelectric cooling device 120, air may flow inwards from the sides of the piezoelectric cooling device 120. This general air flow provides cooling to the stacked package 100 by exhausting heated air away from the air channel while cooler air flows into the air channel 115. In embodiments, the ends of the piezoelectric cooling device 120 may be shaped to improve air movement. For example, the planar elements 124 may be fan-shaped or otherwise have an increased surface area to push more air away from the stacked package 100 as illustrated in FIG. 1B.

Piezoelectric cooling device 120 may include one or more planar elements 124 made from a non-piezoelectric material such as plastic, metal, carbon, and/or other suitable material. Planar element(s) 124 may have a portion that is coupled to piezoelectric actuator 122 and have one or more free ends that vibrate when piezoelectric actuator 122 is vibrated. Planar element(s) 124 may cause amplification of the oscillation of piezoelectric actuator such that the free ends of planar element(s) 124 oscillate over a greater distance than piezoelectric actuator 122. For example, oscillation of the free ends of planar element 124 may be amplified by actuation of piezoelectric actuator 122 at a resonant frequency of the piezoelectric actuator 122 and/or planar element 124. As illustrated in FIG. 1A, the piezoelectric actuator 122 and/or the planar element 124 may be disposed within the air channel 115 such that the piezoelectric actuator 122 and/or the planar element 124 are coplanar with a longitudinal axis 118 of the air channel 115.

Planar element(s) 124 may be shaped such that the lateral edge furthest from the piezoelectric actuator 122 has a longer edge distance. For example, planar elements 124 may be trapezoidal in shape with the longer parallel edge of the trapezoid furthest from the piezoelectric actuator 122. In embodiments, the lateral edge furthest from the piezoelectric actuator 122 may be arcuately shaped or semi-circular as illustrated in FIG. 1B.

Piezoelectric actuator 122 may be a piezoelectric active material such as a piezoceramic material that has a polarization that causes a mechanical displacement when an electric field is applied. Piezoelectric element 122 may also be a piezoelectric unimorph, and/or piezoelectric bimorph material. A piezoelectric unimorph includes one active layer and one inactive layer bonded together. The active layer is a piezoelectric layer that deforms when an electric field is applied. The deformation of the active layer causes the piezoelectric unimorph to bend. A piezoelectric bimorph has two active layers separated by an inactive layer such as metal, carbon fiber, and/or other suitable material. Application of electric fields may be used to cause one piezoelectric layer to contract and the other to expand. Therefore, a piezoelectric bimorph is capable of bending in two directions according to the polarity of an applied field. If portion of a piezoelectric bimorph is fixed, application of an alternating electric field can cause a free end of the piezoelectric bimorph to vibrate back and forth.

Figure 2A:
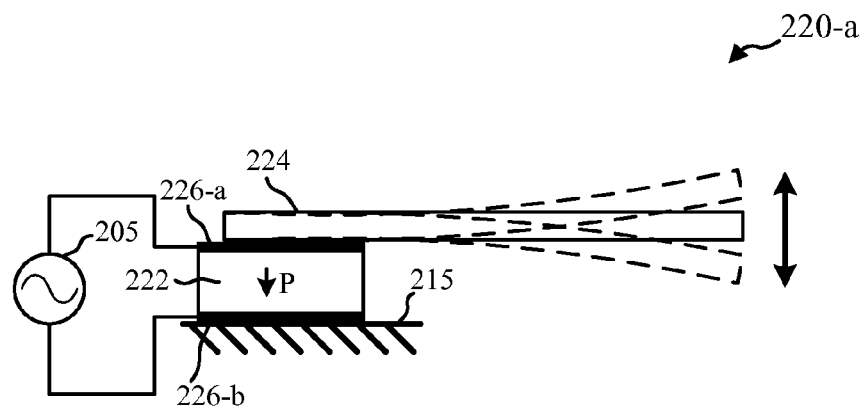
FIG. 2A shows a piezoelectric active cooling device, according to various embodiments.

Turning to FIG. 2A, a piezoelectric cooling device 220-a is illustrated in accordance with various embodiments. Piezoelectric cooling device 220-a includes a piezoelectric actuator 222 fixed to a support 215 and operable to vibrate a planar element 224. Piezoelectric actuator 222 may be polarized in a direction orthogonal to the plane of the planar element 224 and may include electrode layers 226-a and 226-b for application of an electric field using voltage driver 205.

Figure 2B:
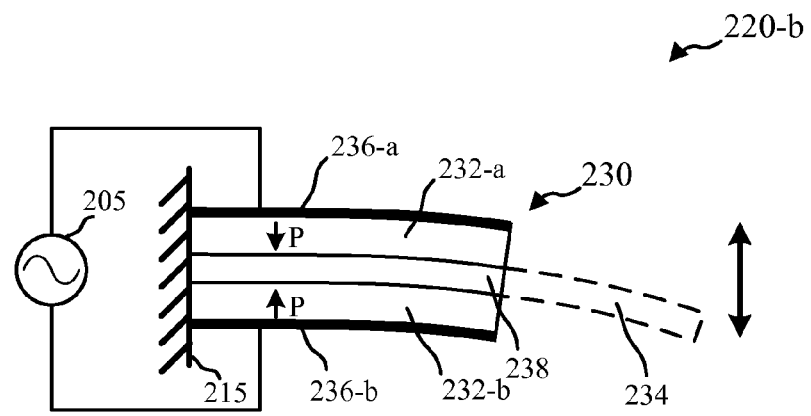
FIG. 2B shows an active cooling device employing a piezoelectric actuator, according to various embodiments.

Turning to FIG. 2B, a piezoelectric cooling device 220-b is illustrated in accordance with various embodiments. Piezoelectric cooling device 220-b includes a piezoelectric bimorph actuator 230 that includes a first piezoelectric layer 232-a, a second piezoelectric layer 232-b, and a center layer 238. In the embodiment illustrated in FIG. 2B, piezoelectric bimorph actuator 230 is illustrated in a serial connection configuration where piezoelectric layers 232-a and 232-b have opposite polarization directions and the electric field from voltage driver 205 is applied across both piezoelectric layers in series. Piezoelectric bimorph actuator 230 may include electrode layers 236-a and 236-b for application of the electric field using voltage source 205. Center layer 238 may be a thin, conductive material such as spring steel or carbon fiber.

Figure 2C:
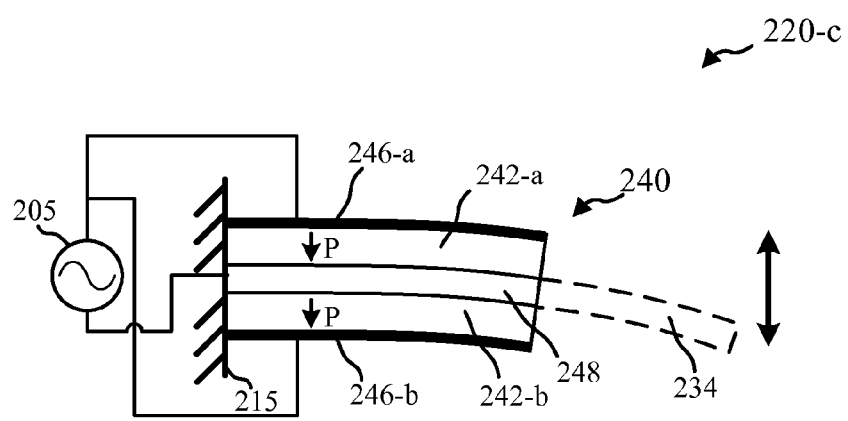
FIG. 2C shows an active cooling device employing a piezoelectric bimorph actuator, according to various embodiments.

Turning to FIG. 2C, a piezoelectric cooling device 220-c is illustrated in accordance with various embodiments. Piezoelectric cooling device 220-c includes a piezoelectric bimorph actuator 240 that includes a first piezoelectric layer 242-a, a second piezoelectric layer 242-b, and a center layer 248. Piezoelectric bimorph actuator 240 may include electrode layers 246-a and 246-b for application of an electric field using voltage driver 205. In the embodiment illustrated in FIG. 2C, piezoelectric bimorph actuator 240 is illustrated in a parallel configuration connection configuration where piezoelectric layers 242-a and 242-b have the same polarization directions and the electric field from voltage driver 205 is applied in parallel between an electrode of each piezoelectric layer (e.g., 246-a, 246-b) and a common electrode. The common electrode may be, for example, center layer 248. Center layer 248 may be a thin, conductive material such as spring steel or carbon fiber.

In embodiments, piezoelectric cooling devices 220-b and/or 220-c may include a planar extension 234 that is attached to the free end of piezoelectric bimorph actuators 230 and/or 240. The planar extension may be made of a rigid material, or it may be made of a flexible material to provide further amplification to the oscillation of the end of the piezoelectric bimorph actuator 230 and/or 240. In embodiments, the planar extension 234 may be an extension of center layer 238 and/or 248. For example, piezoelectric cooling device 120 as illustrated in FIG. 1A and/or FIG. 1B may be constructed according to FIG. 2B and/or FIG. 2C with planar extensions 124 corresponding to planar extensions 234 of piezoelectric actuators 230 and/or 240. In embodiments, planar extensions 234 may be constructed from spring steel, carbon fiber, and/or plastic.

Figure 3A:
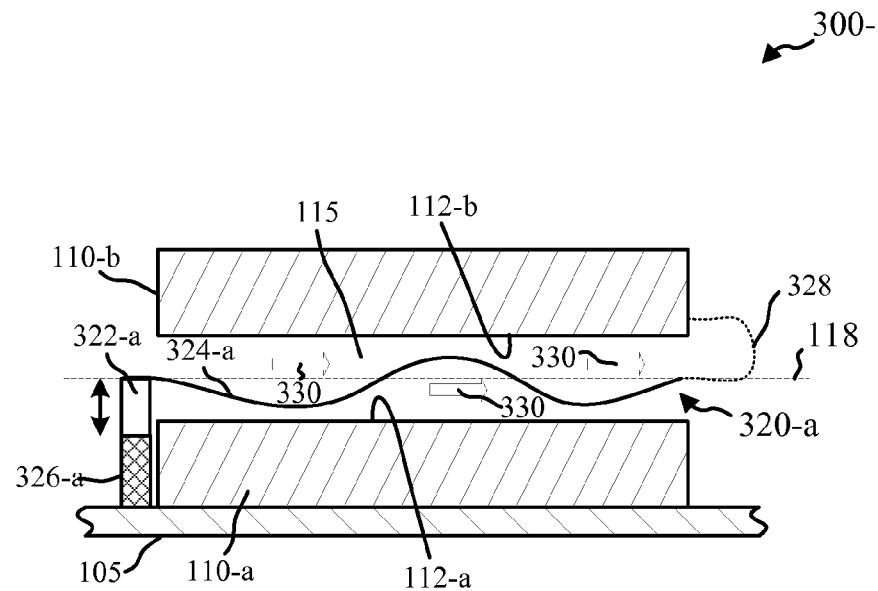
FIG. 3A shows a side view of a stacked semiconductor package employing a traveling wave type piezoelectric active cooling device, according to various embodiments.

FIG. 3A illustrates another embodiment of a stacked package architecture 300-a that employs a piezoelectric active cooling device 320-a, according to various embodiments. In stacked package architecture 300-a, piezoelectric cooling device 320-a includes a piezoelectric element 322-a that vibrates one end of a planar element 324-a to set up a transverse wave in the planar element that travels from the end vibrated by the piezoelectric element 322-a towards the opposite end. In the embodiment of piezoelectric active cooling device 320-a illustrated in FIG. 3A, piezoelectric actuator 322-a vibrates orthogonally to the longitudinal axis 118 of the air channel 115, generally moving the end of the planar element 324-a fixed to the piezoelectric actuator 322-a orthogonally to the longitudinal axis 118.

As the traveling wave on the planar element 324-a moves through air channel 115, it pushes air along with the traveling wave, establishing air flow 330 generally from one side of the stacked package 300-a to the other side through the air channel 115. For example, the transverse wave in the planar element 324-a may deform the planar element 324-a such that the wave height takes up substantially the height of the air channel 115. As the wave travels away from the piezoelectric actuator 322-a, air is pushed along with the wave to the opposite end of the planar element 324-a. Air flowing through the air channel 115 dissipates heat from surfaces 112-a and/or 112-b of the packages 110-a and/or 110-b, and the warmer heated air flows out of the air channel 115 at an air outlet of the air channel, exhausting waste heat from the stacked package 300-a. The planar element 324-a may optionally be coupled to the package 300-a at the outlet end of the air channel 115. For example, planar element 324-a may be coupled to the stacked package 300-a using spring(s) 328 to assist in setting up the transverse traveling wave in the planar element 324-a. The planar element 324-a may be made of a suitably flexible but resilient material such as spring steel, carbon, and/or plastic.

Figure 3B:
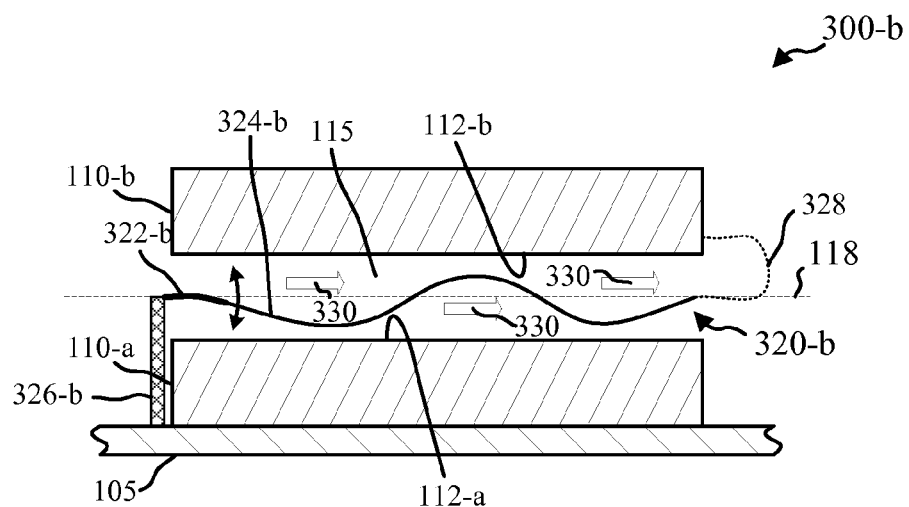
FIG. 3B shows a side view of a stacked semiconductor package employing a traveling wave type piezoelectric active cooling device, according to various embodiments.

FIG. 3B illustrates another embodiment of a stacked package architecture 300-b that employs a piezoelectric active cooling device 320-b, according to various embodiments. Similarly to piezoelectric cooling device 320-a, piezoelectric cooling device 320-b includes a piezoelectric element 322-b that vibrates one end of a planar element 324-b to set up a transverse wave in the planar element that travels from the end vibrated by the piezoelectric element 322-b towards the opposite end. Piezoelectric cooling device 320-b may use a piezoelectric bimorph actuator 322-b to generate the traveling wave in the planar element 324-b. For example, one end of the piezoelectric bimorph 322-b may be fixed to a support 326-b relative to the air channel 115, while the other end is coupled to the planar element 324-b. As an electric field is applied to the piezoelectric bimorph 324-b, the bending of the piezoelectric bimorph 324-b vibrates the end of the planar element 324-b, setting up the transverse traveling wave in the planar element 324-b.

Figure 3C:
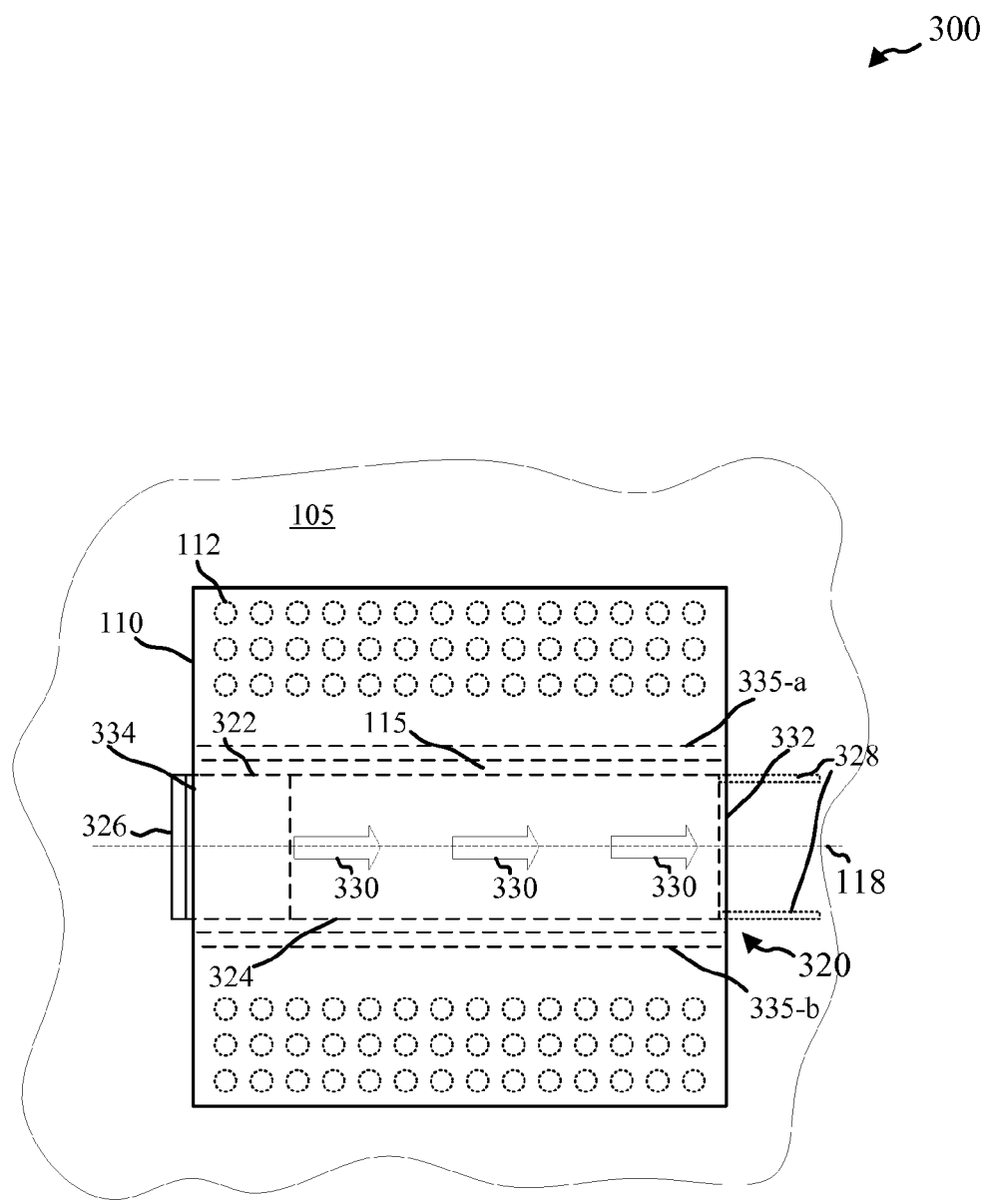
FIG. 3C shows a top view of a stacked semiconductor package employing a traveling wave type piezoelectric active cooling device, according to various embodiments.

FIG. 3C illustrates a top view of stacked package architecture 300, according to various embodiments. For example, FIG. 3C may illustrate a top view of stacked packages 300-a and/or 300-b as illustrated in FIG. 3A and/or FIG. 3B. FIG. 3C illustrates generally the flow of air 330 generated by piezoelectric cooling device 320 through stacked package 300. In embodiments, channel walls 335-a and 335-b may be used to define sides to the air channel 115 to maintain an air flow from an inlet 334 to an outlet 332 of the air channel 115. Thus, air channel 115 may have a cross-section orthogonal to the longitudinal axis 118 where the width of the cross-section is greater than the height of the cross-section.

Figure 4A:
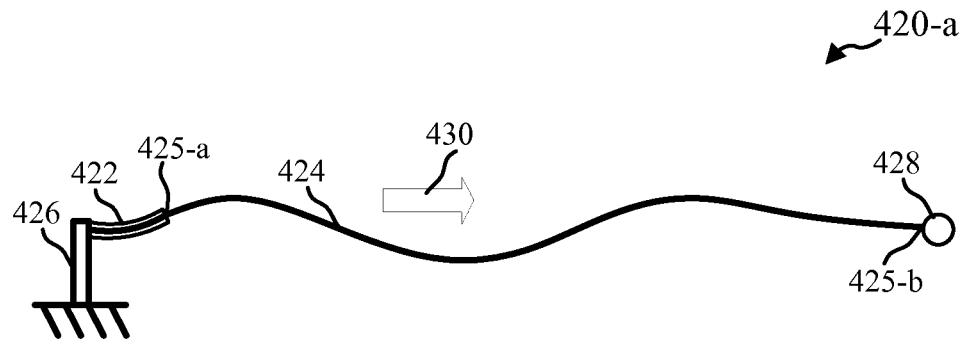
FIG. 4A shows a traveling wave piezoelectric cooling device, according to various embodiments.
Figure 4B:
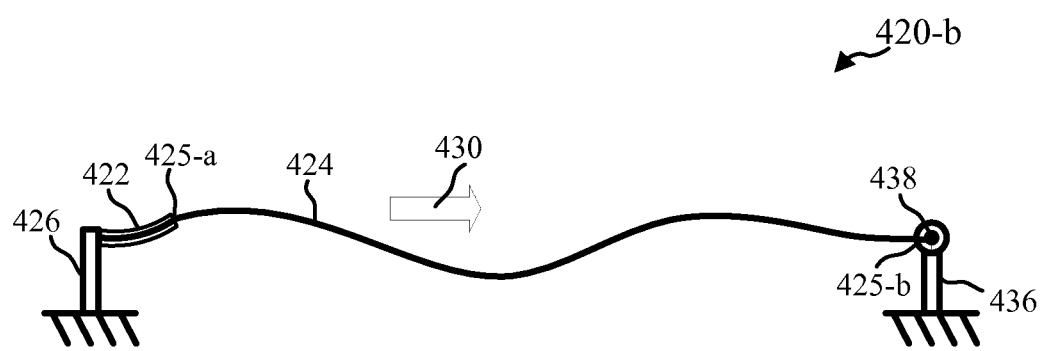
FIG. 4B shows a traveling wave piezoelectric cooling device, according to various embodiments.
Figure 4C:
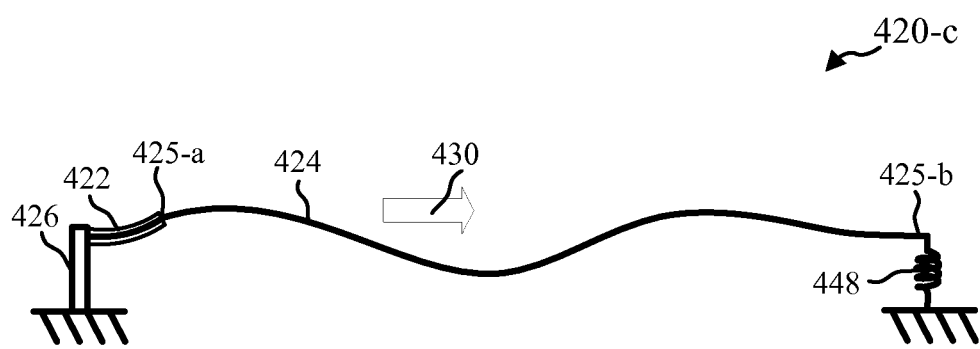
FIG. 4C shows a traveling wave piezoelectric cooling device, according to various embodiments.

FIGS. 4A-4C illustrate various embodiments of piezoelectric cooling devices 420 that move air by setting up a transverse traveling wave in a planar element. In one embodiment illustrated in FIG. 4A, a traveling wave piezoelectric cooling device 420-a employs a weighted end to help in generating the traveling wave in the planar element. Piezoelectric cooling device 420-a may be used to cause air to move within a mobile device or air channel within a mobile device. In piezoelectric cooling device 420-a, piezoelectric bimorph actuator 422 is attached at one end to a mobile device or air channel of a mobile device at support 426. An opposing end of the piezoelectric bimorph actuator 422 is attached to one end 425-a of a planar element 424 and vibrates upon actuation of the piezoelectric bimorph actuator 422. Actuation of piezoelectric bimorph actuator 422 causes a traveling wave in planar element 424 that generally travels from end 425-a towards end 425-b of the planar element 424. When piezoelectric cooling device 420-a is employed within an air channel, the traveling wave pushes air generally in direction 430 from the end of the planar element 425-a attached to the piezoelectric bimorph actuator 422 to the opposite end 425-b. In piezoelectric cooling device 420, the opposite end 425-b of the planar element 424 is attached to weight 428 that dampens movement of the end 425-b to help in generating the traveling wave.

In the embodiment of a piezoelectric cooling device 420-b illustrated in FIG. 4B, end 425-b of planar element 424 is rotationally attached to support 436 through rotational coupling 438. For example, rotational coupling 438 may support sides of end 425-b of planar element 424 using a pin inserted into a sleeve that allows planar element 424 to rotate relative to support 436. Rotational coupling 438 may assist in generating the traveling wave on planar element 424 using oscillation of piezoelectric actuator 422.

In the embodiment of a piezoelectric cooling device 420-c illustrated in FIG. 4C, planar element 424 is attached at the opposite end from the piezoelectric actuator using a spring 448. Spring 448 may be a leaf-type spring, coil-type spring, and/or any other type of spring that allows some vertical movement and/or rotational movement at the end 425-*b* of planar element 424 but provides a feedback force that helps to set up the traveling wave in planar element 424.

The amount of cooling provided by piezoelectric active cooling devices 120, 220, 320, and/or 420 illustrated in FIG. 1A, FIG. 1B, FIG. 2A, FIG. 2B, FIG. 2C, FIG. 3A, FIG. 3B, FIG. 4A, FIG. 4B, and/or FIG. 4C may be controlled by controlling the amplitude and frequency of oscillation of the piezoelectric actuator. For example, the amplitude of deflection of a piezoelectric bimorph may be proportional to the amplitude of an applied voltage. Therefore, varying the amplitude of an applied alternating voltage may be used to vary the amount of air movement. Varying the frequency of the piezoelectric actuator will also vary the amount of air movement. For example, higher actuation frequencies may push more air in fan-type and traveling wave type piezoelectric cooling devices. However, relatively low frequency actuation may provide sufficient cooling without creating audible sound waves that may be objectionable to a user. In embodiments, the piezoelectric actuator is driven at frequencies below an audible frequency level, for example, at a frequency lower than about 20 Hz. Alternatively, the piezoelectric actuator may be driven at higher frequencies, including frequencies within the auditory range or even above the auditory frequency range (e.g., greater than about 20 KHz). Different types of drive signals may also be used with piezoelectric active cooling devices 120, 220, 320, and/or 420. For example, sine wave, square wave, triangular wave, and/or other types of drive signals may be used depending on the desired actuation of the piezoelectric actuator.

The mobile computing device may include one or more temperature sensors and a control block that measures the temperature of the mobile computing device and controls the actuation of the piezoelectric actuator according to the measured temperature. The alternating voltage applied to the piezoelectric actuator may be generated by a switching circuit or other circuit that generates an alternating voltage or be generated by a self-resonant circuit that oscillates at the resonant frequency of the piezoelectric actuator.

Figure 5:
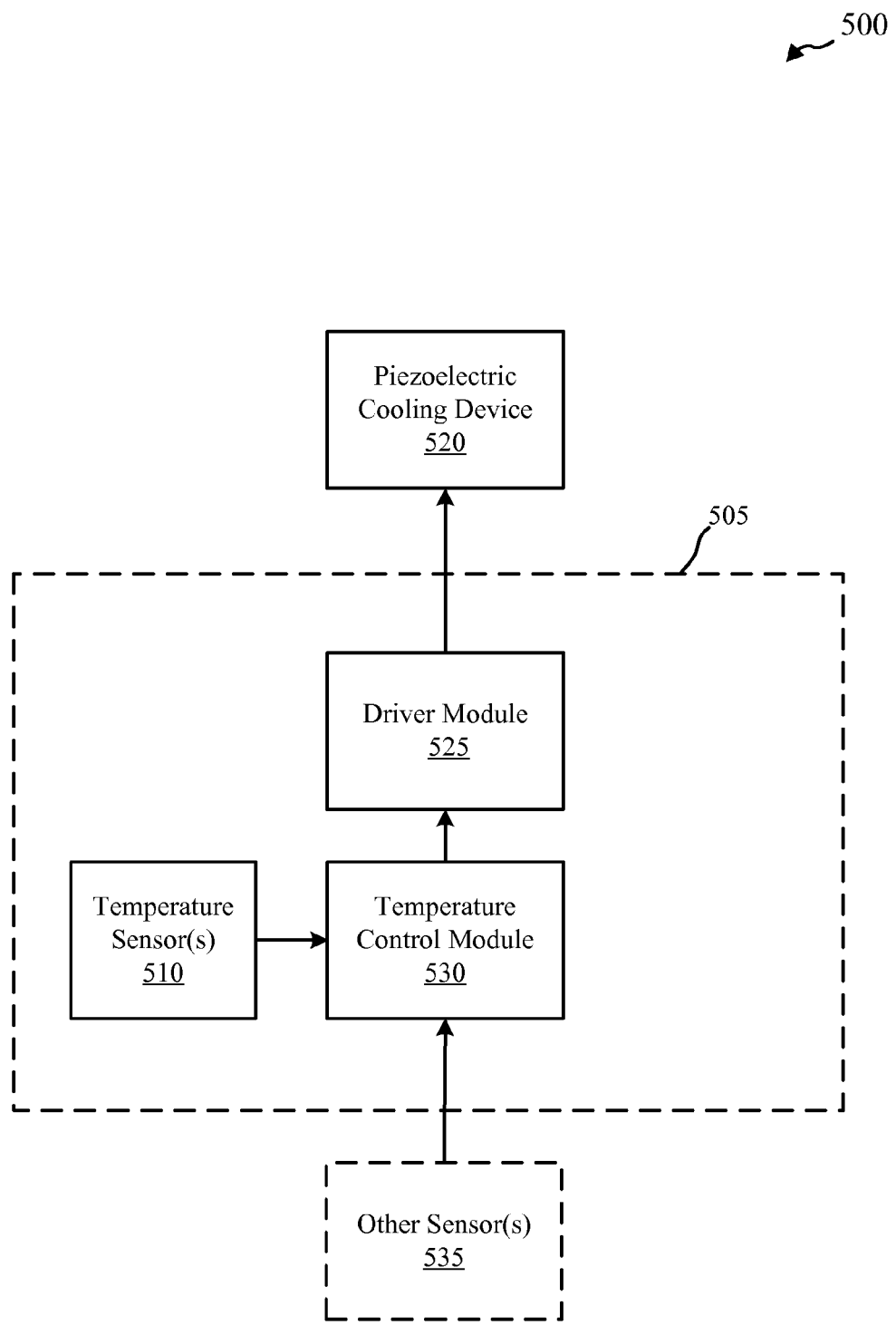
FIG. 5 shows a block diagram of a control system for a piezoelectric active cooling device in a mobile device, according to various embodiments.

FIG. 5 is a block diagram of an active cooling system 500 for a mobile device in accordance with various embodiments. System 500 may include one or more temperature sensors 510, piezoelectric active cooling device 520, a temperature control module 530, and/or a driver module 525. In system 500, piezoelectric active cooling device 520 may be one of the fan-type or traveling wave type piezoelectric active cooling devices 120, 220, 320, and/or 420 illustrated in FIG. 1A, FIG. 1B, FIG. 2A, FIG. 2B, FIG. 2C, FIG. 3A, FIG. 3B, FIG. 4A, FIG. 4B, and/or FIG. 4C.

Temperature sensor(s) 510, temperature control module 530, and/or driver module 525 may be implemented as components housed within a semiconductor package such as the stacked packages 100 and/or 300 illustrated in FIG. 1A, FIG. 1B, FIG. 3A, and/or FIG. 3B. For example, temperature sensor(s) 510, temperature control module 530, and/or driver module 525 may be implemented on a processor 505 housed within a semiconductor package such as semiconductor packages 100 and/or 300. The temperature sensor(s) may be on-chip temperature sensors on processor 505, positioned at other locations within the semiconductor package, and/or may be external to the semiconductor package. For example, one or more of temperature sensor(s) 510 may be located in the air channel to measure the temperature of a heat dissipation surface of the air channel, or the air temperature of the air channel (e.g., inlet air temperature, outlet air temperature, etc.). Driver module 525 may include one or more components (e.g., digital to analog converters (DACs), op-amps, transistors, capacitors, inductor, resistors, etc.) that generate an analog drive voltage or use the resonance of the piezoelectric actuator to create a self-resonant circuit that may be controlled via a control voltage or other control input.

System 500 may be configured to control piezoelectric active cooling device 520 to maintain a certain temperature of components within the semiconductor package and/or mobile device. For example, temperature control module 530 may be configured to monitor temperature sensor(s) 510 and control piezoelectric active cooling device 520 via driver module 525 based on the monitored temperature. In an embodiment, temperature control module 530 is configured to drive piezoelectric active cooling device 520 to cause air to move within the mobile device when the measured temperature exceeds a temperature threshold.

Control of piezoelectric active cooling device 520 may include control of drive voltage and/or drive frequency of a piezoelectric actuator of piezoelectric active cooling device 520. For example, in an amplitude control configuration, the amplitude of the drive voltage for a piezoelectric actuator of piezoelectric active cooling device 520 may be controlled based on temperature. In some embodiments, temperature control module 530 is configured to control a drive voltage amplitude of piezoelectric active cooling device 520 via driver module 525 based on the monitored temperature according to a predetermined temperature vs. voltage relationship using multiple temperature set-points or thresholds (e.g., look-up-table, predefined equation, linear interpolation, etc.). In a frequency control configuration, drive frequency of the piezoelectric actuator of piezoelectric active cooling device 520 is controlled based on temperature. In some embodiments, amplitude and frequency of the drive voltage for a piezoelectric actuator of piezoelectric active cooling device 520 are controlled simultaneously. For example, in traveling wave configurations such as those illustrated in FIGS. 3A, 3B, 3C, 4A, 4B, and/or 4C, frequency and amplitude of the drive voltage to piezoelectric actuator may be controlled using a linear or non-linear relationship to vary air movement while maintaining a traveling wave on the planar element.

System 500 may also include other sensor(s) 535 such as ambient air sensors, orientation sensors, air flow sensors, etc. For example, other sensor(s) 535 may include one or more air flow sensors and temperature control module 530 may control piezoelectric active cooling device 520 to provide a predetermined air flow through the mobile device based on a temperature reading of temperature sensor(s) 510. In one embodiment, temperature control module 530 varies drive voltage and/or frequency of a piezoelectric actuator of piezoelectric active cooling device 520 based on measured air flow from air flow sensor(s) 535 and temperature readings of temperature sensor(s) 510. Air flow may be controlled in a predetermined relationship to measured temperature of the temperature sensor(s) 510 of the mobile device. In embodiments, an air flow sensor 535 may detect when air flow in an air channel of a mobile device is impeded and prevent operation of the piezoelectric active cooling device 520 when air flow is impeded in the air channel. For example, when a mobile device is placed in a protective sleeve, pocket, or other environment that impedes air flow, the piezoelectric cooling device may be deactivated.

The components of system 500 may, individually or collectively, be implemented with one or more Application Specific Integrated Circuits (ASICs) adapted to perform some or all of the applicable functions in hardware. Alternatively, the functions may be performed by one or more other processing units (or cores), on one or more integrated circuits. In other embodiments, other types of circuit components may be used (e.g., Structured/Platform ASICs, Field Programmable Gate Arrays (FPGAs), other Semi-Custom ICs, other digital or analog ICs, and/or other discrete components), which may be programmed in any manner known in the art. The functions of each unit may also be implemented, in whole or in part, with instructions embodied in a memory, formatted to be executed by one or more general or application-specific processors. It will be apparent to those skilled in the art that substantial variations may be used in accordance with specific requirements. For example, customized hardware might also be used, or particular elements might be implemented in hardware, software (including portable software, such as applets), or both.

Some embodiments include an air channel of the mobile device that employs channel wall structures that improve the air flow within the channel and/or away from the mobile device. In some embodiments, the air channel may include channel walls that define air inlet ports and/or air outlet ports, and/or direct air flow within the mobile device. In some embodiments, the air channel walls are tapered or arcuately shaped at an outlet port of the air channel to improve the air flow generated by a piezoelectric active cooling device that is configured with a freely vibrating end at or near the outlet port. The air channel may be tapered or arcuately shaped to substantially match the extent of vibration of the freely vibrating end of the piezoelectric active cooling device. For example, a piezoelectric active cooling device may be fixed towards the middle or interior of the air channel and one or more ends of the piezoelectric active cooling device may be free to vibrate towards an outlet port of the air channel. The air channel may have a smaller height towards the middle or interior of the air channel where the extent of vibration of the piezoelectric active cooling device is smaller and a larger height towards the outlet port where the freely vibrating end of the piezoelectric active cooling device vibrates over a larger extent. The air channel walls may be tapered between the smaller height and the larger height to substantially match the extent of vibration of the piezoelectric active cooling device along the length of the device. For example, the air channel walls may be linearly tapered between the smaller height and the larger height or may be arcuately shaped to substantially match the curved shape of the piezoelectric active cooling device at an extent of travel when vibrated.

Figure 6A:
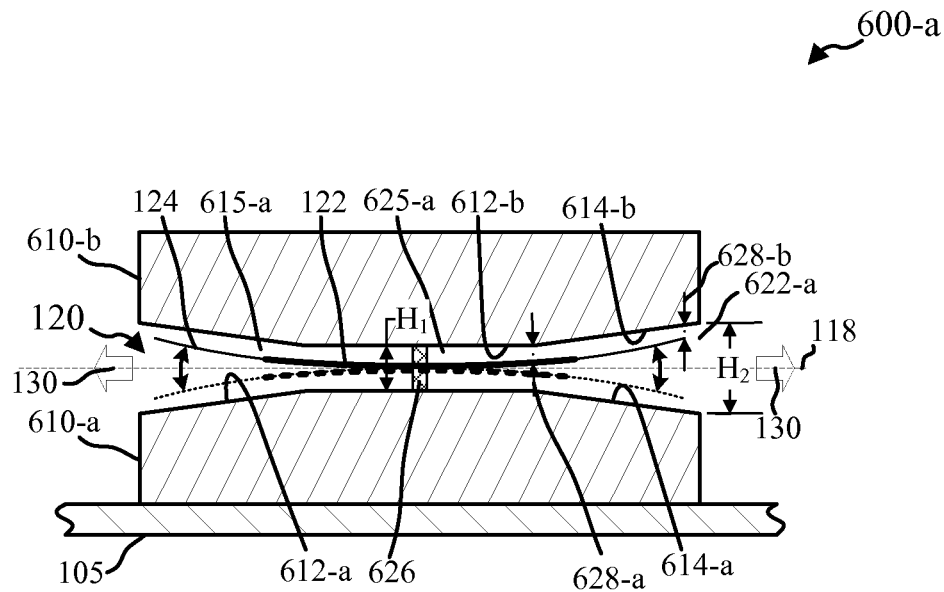
FIG. 6A shows a side view of a stacked semiconductor package employing a piezoelectric active cooling device within an air channel with tapered walls, according to various embodiments.

FIG. 6A shows a side view of a stacked semiconductor package 600-*a* employing a piezoelectric active cooling device 120 within an air channel 615-*a* with tapered walls, according to various embodiments. The stacked semiconductor package 600-*a* includes a first package 610-*a* and a second package 610-*b*. The top surface 612-*a* of the first package 610-*a* and the bottom surface 612-*b* of the second package 610-*b* define surfaces or channel walls of the air channel 615-*a*. The piezoelectric active cooling device 120 may be coupled to the stacked semiconductor package 600-*a* within the air channel using support 626. An end of the piezoelectric active cooling device 120 may be freely vibrating. The freely vibrating end may be located at or near an outlet port 622-*a* of the air channel 615-*a*.

The air channel 615-*a* may include a portion 625-*a* having a smaller dimension perpendicular to a planar element of the piezoelectric active cooling device 120 towards the interior or middle of the air channel 615-*a*. For example, the portion 625-*a* may be adjacent to the middle or an end of the piezoelectric active cooling device 120 that is coupled to the stacked semiconductor package 600-*a*. The air channel walls 612-*a* and/or 612-*b* may have tapered portions 614-*a* and/or 614-*b* such that the air channel 615-*a* has a larger dimension at the outlet port 622-*a*. The tapered portions 614-*a* and/or 614-*b* may be linearly tapered between the smaller dimension and the larger dimension. The tapered portions 614-*a* and 614-*b* may be tapered such that a distance between the extent of the vibration of the piezoelectric active cooling device 120 and the channel wall is approximately constant at the beginning and end of the taper. For example, a distance 628-*a* between the activated piezoelectric active cooling device 120 and the tapered portion 614-*b* at the point where the taper starts may be approximately equal to a distance 628-*b* between the end of the activated piezoelectric active cooling device 120 and the tapered portion 614-*b*.

Figure 6B:
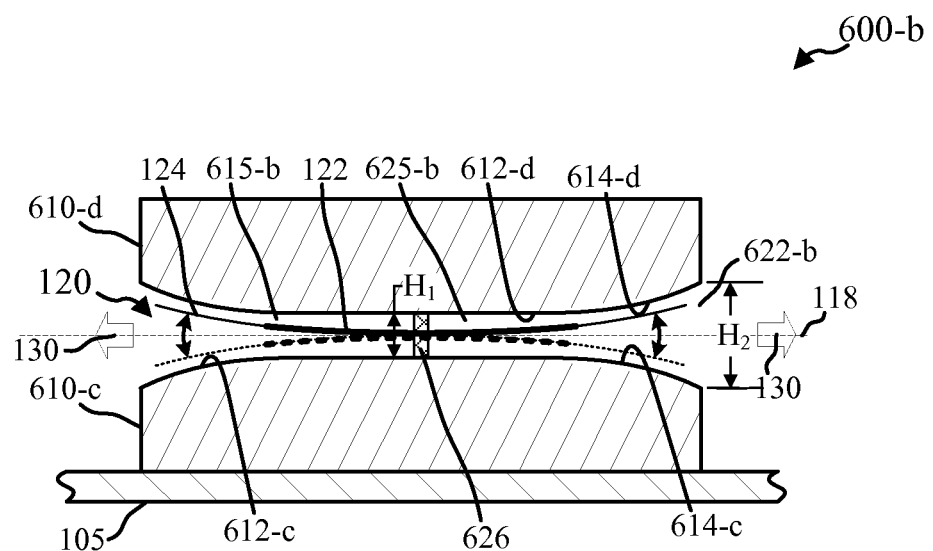
FIG. 6B shows a side view of a stacked semiconductor package employing a piezoelectric active cooling device within an air channel with arcuately shaped walls, according to various embodiments.

FIG. 6B shows a side view of a stacked semiconductor package 600-*b* employing a piezoelectric active cooling device 120 within an air channel 615-*b* with arcuately shaped walls, according to various embodiments. The stacked semiconductor package 600-*b* includes a first package 610-*c* and a second package 610-*d*. The top surface 612-*c* of the first package 610-*c* and the bottom surface 612-*d* of the second package 610-*d* define surfaces or channel walls of the air channel 615-*b*. The piezoelectric active cooling device 120 may be coupled to the stacked semiconductor package 600-*b* within the air channel using support 626. An end of the piezoelectric active cooling device 120 may be freely vibrating. The freely vibrating end may be located at or near an outlet port 622-*b* of the air channel 615-*b*.

The air channel 615-*b* may include a portion 625-*b* having a smaller dimension perpendicular to a planar element of the piezoelectric active cooling device 120 towards the interior or middle of the air channel 615-*b*. For example, the portion 625-*b* may be adjacent to the middle or an end of the piezoelectric active cooling device 120 that is coupled to the stacked semiconductor package 600-*b*. The air channel walls 612-*c* and 612-*d* may include arcuately shaped portions 614-*c* and/or 614-*d* such that the air channel 615-*b* has a larger dimension at the outlet port 622-*b*. The arcuately shaped portions 614-*c* and 614-*d* may have a shape that substantially matches the curved shape of the extent of the piezoelectric active cooling device 120 when it is vibrated.

Figure 6C:
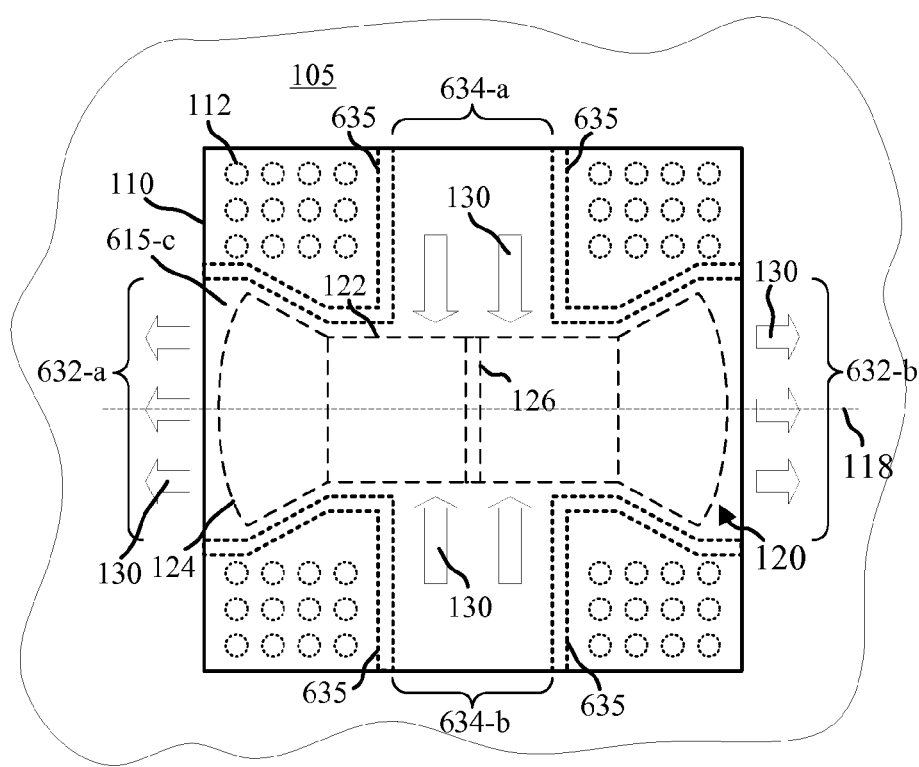
FIG. 6C shows a top view of a stacked semiconductor package employing a piezoelectric active cooling device, according to various embodiments.

FIG. 6C illustrates a semiconductor package 600-*c* that uses a piezoelectric cooling device 120 in accordance with various embodiments. In semiconductor package 600-*c*, air channel walls 635 generally define air channel 615-*c* to have two air inlet ports 634-*a* and 634-*b*, and two air outlet ports 632-*a* and 632-*b*. Air channel walls 635 may generally follow the shape of the sides of the piezoelectric active cooling device 120 for a portion of the length of the piezoelectric active cooling device 120. Piezoelectric active cooling device 120 fans air away from air outlet ports 632-*a* and 632-*b*, generally establishing an air flow that flows in air inlet ports 634-*a* and 634-*b* on opposing sides of the package and out air outlet ports 632-*a* and 632-*b* on the other opposing sides of the package. The air inlet ports 634-*a* and 634-*b* may have upper and lower surfaces that are substantially coplanar with the top and bottom surfaces of the air channel 615-*c* and are joined with the air channel 615-*c* at a side of the air channel adjacent to a lateral edge of the piezoelectric active cooling device 120. The air inlet ports may be joined with the air channel 615-*c* at a portion of the side of air channel 615-*c* while the channel walls 635 block air flow from the inlet ports 634-*a* and 634-*b* to other portions of the air channel 615-*c*.

While FIG. 1A, FIG. 1B, FIG. 3A, FIG. 3B, FIG. 3C, and FIG. 6 illustrate piezoelectric active cooling devices 120 and 320 employed within air channels 115, 615-*a*, 615-*b*, and/or 615-*c* of a stacked package, these devices may be employed in other suitable air channels of a mobile device. For example, an air channel may be designed into the case of a mobile computing device, and a piezoelectric cooling device according to disclosed embodiments may be used to develop air flow through the air channel of the mobile computing device. Air channels in the mobile device may have air inlet and outlet ports on the housing of the mobile device, with portions of the air channel defined by an air gap in a stacked package of the mobile device. For example, semiconductor package 600-c may be integrated within a mobile device such that inlet ports 634-a and 634-b correspond to inlet ports on the mobile device and outlet ports 632-a and 632-b correspond to outlet ports on the mobile device. In this way, ambient air may be caused to move within the mobile device and directly cool a semiconductor package 600-c where much of the waste heat of the mobile device may be generated.

Figure 7:
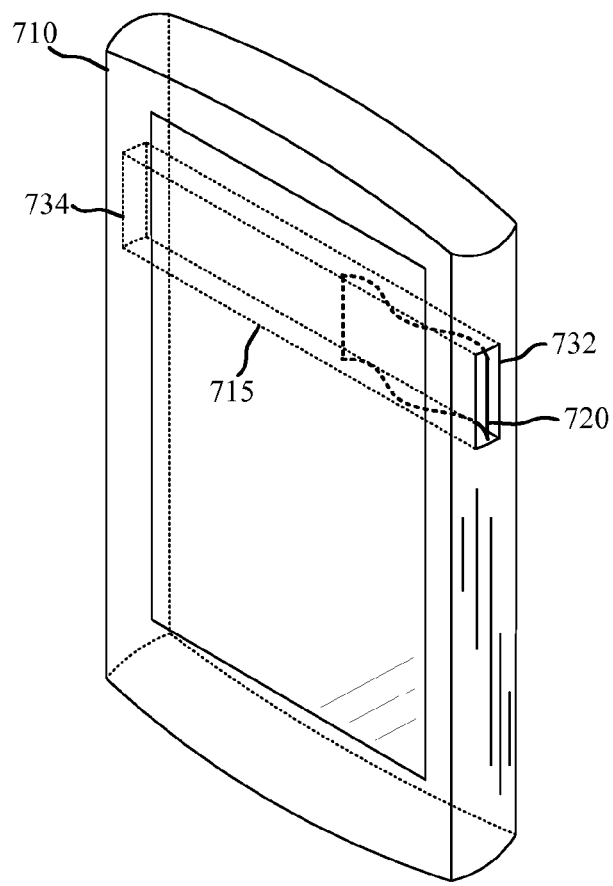
FIG. 7 shows a mobile device employing a piezoelectric active cooling device, according to various embodiments.

FIG. 7 illustrates a mobile device 700 that employs a piezoelectric active cooling device to move air within an air channel 715 of the mobile device in accordance with various embodiments. As illustrated in FIG. 7, mobile device 700 includes air channel 715 with an air inlet 734 and air outlet 732. Piezoelectric active cooling device 720 is illustrated positioned in air channel 715 to move air generally from air inlet port 734 to air outlet or exhaust port 732. Piezoelectric active cooling device 720 is illustrated in FIG. 7 as a traveling wave type piezoelectric cooling device. However, fan-type piezoelectric cooling devices as described with reference to FIG. 1A, FIG. 1B, and FIG. 6 may also be employed within air channel 715 to cause air to move within the mobile device.

Surfaces of air channel 715 may be in thermal communication with components of the mobile device 700 that generate waste heat. For example, surfaces of air channel 715 may be surfaces of heat-sink elements for components such as processing components of the mobile device 700. In an embodiment, a portion of air channel 715 includes an air gap in a stacked package that houses processing and/or other computing components of the mobile device such as the stacked packages 100, 300, 600-a, 600-b, and/or 600-c described with reference to FIG. 1A, FIG. 1B, FIG. 3A, FIG. 3B, FIG. 3C, FIG. 6A, FIG. 6B, and/or FIG. 6C. Additionally, air channel 715 may include more than one air inlet port 734 and/or air outlet port 732. For example, air channel 715 may include two air inlet ports 734 generally corresponding to air inlet ports 634-a and 634-b of stacked package 600-c and two air outlet ports 732 generally corresponding to air outlet ports 632-a and 632-b of stacked package 600-c. In embodiments, air channel 715 may include tapered and/or arcuately shaped air channel wall portions such as air channel 615-a and/or 615-b as illustrated in FIG. 6A and/or FIG. 6B.

Figure 8A:
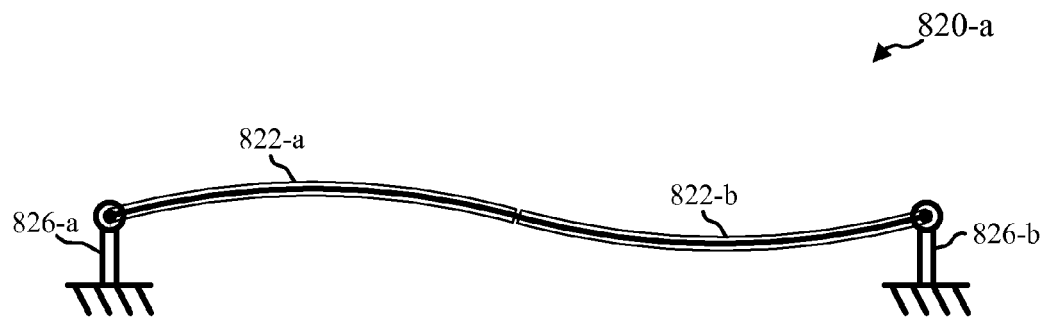
FIG. 8A shows a piezoelectric active cooling device employing multiple piezoelectric bimorph segments, according to various embodiments.

In embodiments, a piezoelectric active cooling device may include multiple planar piezoelectric bimorph segments that are coupled together to form a piezoelectric active cooling device. FIG. 8A illustrates a piezoelectric active cooling device 820-a that includes two piezoelectric bimorph segments 822-a and 822-b. The piezoelectric bimorph segments 822-a and 822-b may be coupled at supports 826-a and 826-b to a mobile device or air channel within the mobile device, and coupled together mechanically at the middle of the piezoelectric active cooling device 820-a. Actuation of the piezoelectric bimorphs 822-a and 822-b of piezoelectric cooling device 820-a using out of phase alternating voltage waveforms will cause each segment to bend in alternate directions, generally approximating a standing wave in piezoelectric cooling device 820-a.

Figure 8B:
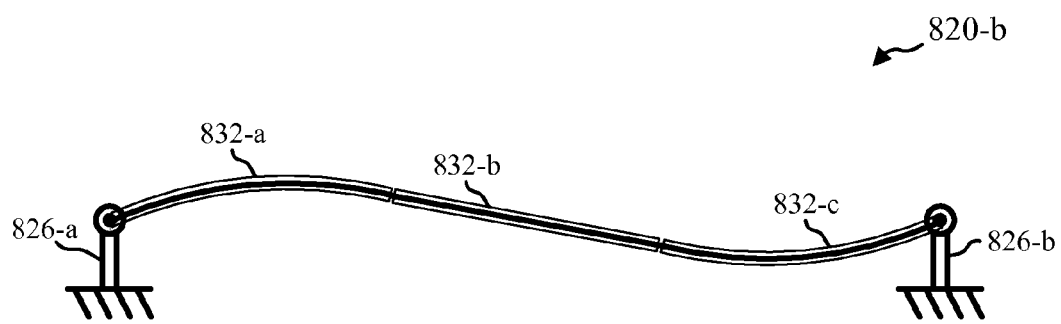
FIG. 8B shows a piezoelectric active cooling device employing multiple piezoelectric bimorph segments, according to various embodiments.

In some embodiments, an approximation of a transverse traveling wave may be generated using more than two piezoelectric bimorph segments that are joined end-to-end in a piezoelectric active cooling device. For example, FIG. 8B illustrates an embodiment of a planar active cooling device 820-b with three piezoelectric bimorph segments joined end-to-end. One end of the first piezoelectric bimorph segment 832-a may be coupled to support 826-a, with the other end coupled to one end of piezoelectric bimorph segment 832-b, which is coupled at the other end to one end of piezoelectric bimorph segment 832-c. The other end of piezoelectric bimorph segment 832-c may be coupled to support 826-b. Piezoelectric bimorph segments 832-a, 832-b, and 832-c may be driven with alternating voltage waveforms having different respective phases, causing an approximation of a transverse traveling wave in planar piezoelectric active cooling device 820-b.

Figure 8C:
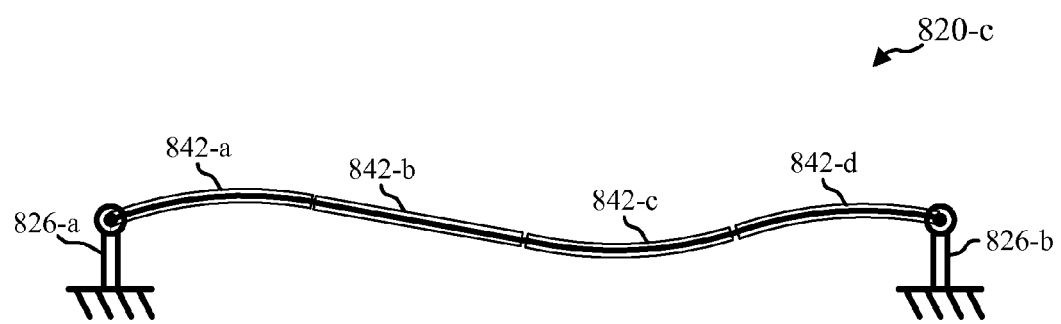
FIG. 8C shows a piezoelectric active cooling device employing multiple piezoelectric bimorph segments, according to various embodiments.

It may be appreciated that more piezoelectric bimorph segments may allow a closer approximation of a transverse traveling wave in the planar piezoelectric active cooling device. For example, FIG. 8C illustrates an embodiment of a planar piezoelectric active cooling device 820-c with four piezoelectric bimorph segments (842-a, 842-b, 842-c, and 842-d) joined end-to-end and coupled to a mobile device and/or air channel at supports 826-a and/or 826-b. As with planar piezoelectric active cooling device 820-b, piezoelectric bimorph segments 842-a, 842-b, 842-c, and 842-d may be driven with alternating voltage waveforms having different respective phases, causing an approximation of a transverse traveling wave in planar piezoelectric active cooling device 820-c. While more segments may allow a closer approximation of a transverse travelling wave, a planar piezoelectric active cooling device having as few as three segments as illustrated in FIG. 8B may provide air movement within an air channel that is generally in one direction.

While FIGS. 8A, 8B, and 8C illustrate piezoelectric active cooling devices 820-a, 820-b, and/or 820-c rotationally coupled to supports 826-a and/or 826-b, other coupling methods may be used for multi-segment piezoelectric bimorph active cooling devices. For example, piezoelectric active cooling devices 820-a, 820-b, and/or 820-c may be coupled to supports 826-a and/or 826-b using coupling methods including those illustrated for end 425-b of planar element 424 of FIGS. 4A, 4B, and/or 4C, and/or other coupling methods.

Figure 9:
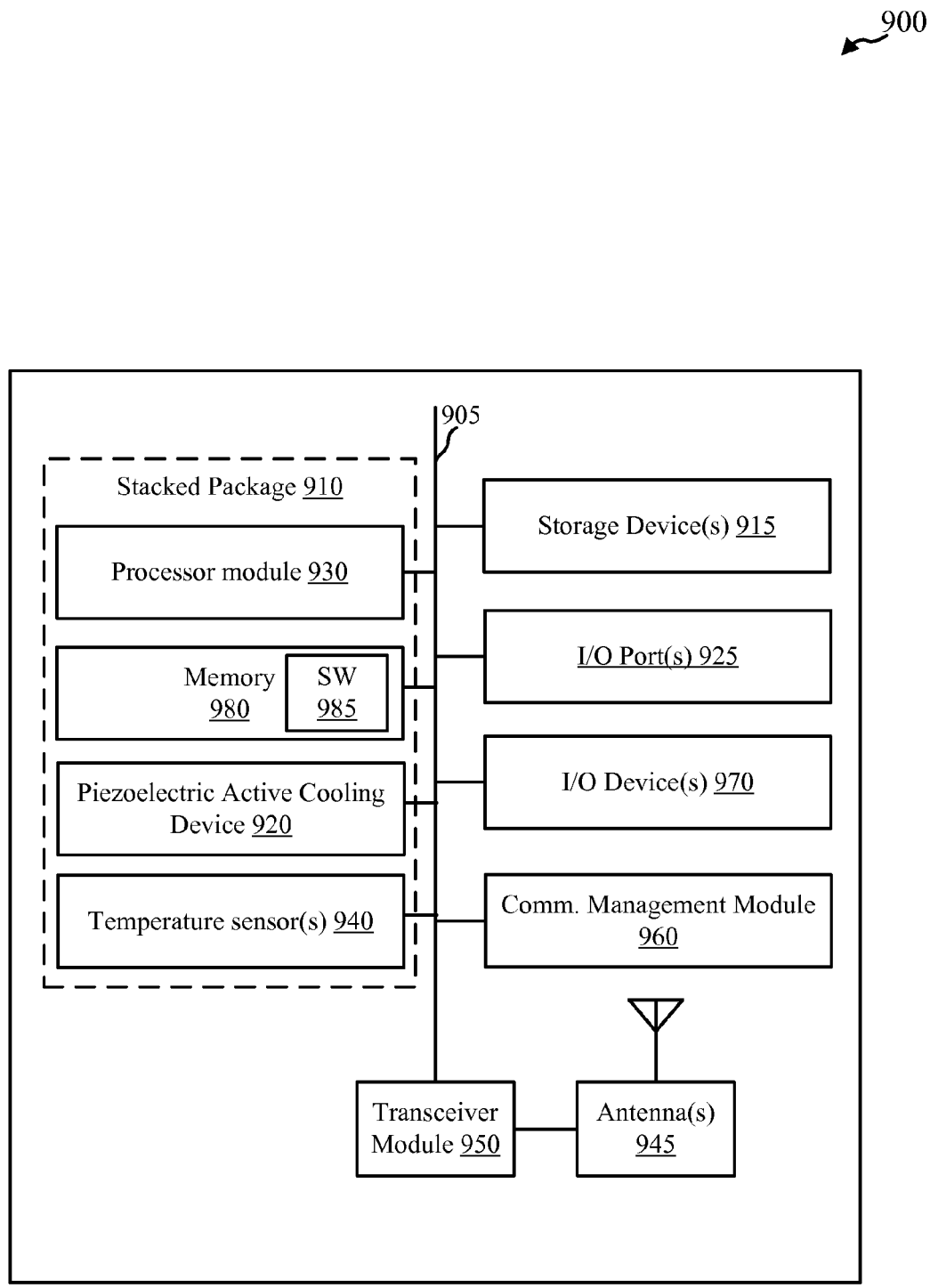
FIG. 9 shows a block diagram of a mobile device employing a piezoelectric active cooling device, according to various embodiments.

FIG. 9 shows a block diagram of a mobile device 900 that employs a piezoelectric active cooling device in accordance with various embodiments. Mobile device 900 may include processor module 930, temperature sensor(s) 940, memory 980, piezoelectric active cooling device 920, storage device(s) 915 (e.g., SSD, disk drive, etc.), I/O port(s) 925 (e.g., USB, power supply, video, audio, etc.), I/O device(s) 970 (e.g., touch-screen, QWERTY keyboard, scroll-wheel, click-wheel, buttons, etc.), communications management module 960, transceiver module 950, and/or antenna(s) 945. These components may be communicatively coupled through one or more electrical interfaces such as bus 905. Processor module 930, temperature sensor(s) 940, memory 980, and/or piezoelectric active cooling device 920 may be configured in a stacked package semiconductor package 910 such as stacked packages 100, 300, 600-a, 600-b, and/or 600-c as described above with reference to FIG. 1A, FIG. 1B, FIG. 3A, FIG. 3B, FIG. 3C, FIG. 6A, FIG. 6B, and/or FIG. 6C. Piezoelectric active cooling device 920 may be one of the fan-type or traveling wave type piezoelectric cooling devices 120, 220, 320, 420, and/or 820 as described above with reference to FIG. 1A, FIG. 1B, FIG. 2A, FIG. 2B, FIG. 2C, FIG. 3A, FIG. 3B, FIG. 3C, FIG. 4A, FIG. 4B, FIG. 4C, FIG. 8A, FIG. 8B, and/or FIG. 8C.

The memory 980 may store computer-readable, computer-executable software code 985 containing instructions that are configured to, when executed, cause the processor module 930 to perform various functions described herein (e.g., monitor temperature sensors and/or other sensors, control drive attributes of piezoelectric active cooling device 920, etc.). Alternatively, the software code 985 may not be directly executable by the processor module 930 but be configured to cause the processor module 930 (e.g., when compiled and executed) to perform functions described herein. Processor module 930 may include one or more processing cores that perform the functions described herein. For example, the instructions may cause the processor module to receive a measured temperature from a temperature sensor, compare the measured temperature against a temperature threshold, and control the piezoelectric active cooling device 920 to move air to cool the mobile device.

Figure 10A:
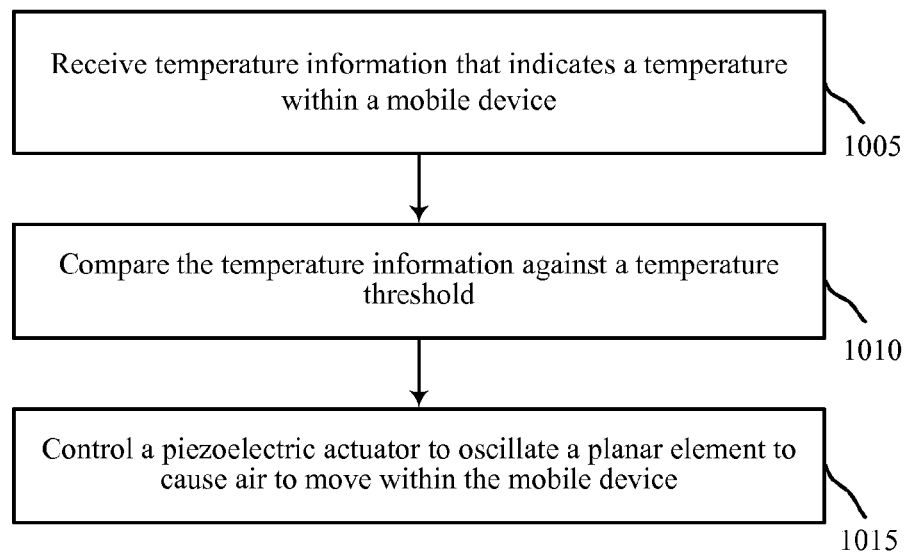
FIG. 10A shows a block diagram of a method for providing active cooling for a mobile computing device, according to various embodiments.

FIG. 10A shows a flow diagram of a method 1000-*a* for active cooling of a mobile device in accordance with various embodiments. Method 1000-*a* may be implemented utilizing various mobile devices such as mobile devices 500 and/or 700 as seen in FIG. 5 and/or FIG. 7, employing piezoelectric active cooling devices including, but not limited to, piezoelectric active cooling devices 120, 220, 320, 420 and/or 820 as seen in FIG. 1A, FIG. 1B, FIG. 2A, FIG. 2B, FIG. 2C, FIG. 3A, FIG. 3B, FIG. 3C, FIG. 4A, FIG. 4B, FIG. 4C, FIG. 8A, FIG. 8B, and/or FIG. 8C.

At block 1005 of method 1000-*a*, temperature information that indicates a temperature within a mobile device is received. The temperature information may indicate the temperature of a processor of the mobile device or other internal temperature of the mobile device such as the temperature of a heat dissipation surface of an air channel within the mobile device. For example, temperature information may be received in a processor of a mobile device such as processor module 930 of mobile device 900 from temperature sensor(s) 940.

At block 1010 of method 1000-*a*, the temperature information is compared with a temperature threshold. For example, the temperature threshold may be set by a desired operational temperature of the mobile device or a component of the mobile device. For example, the temperature threshold may be set according to a maximum desired operational temperature of a processor of the mobile device. At block 1015, a piezoelectric actuator may be controlled to oscillate a planar element to cause air to move within the mobile device.

Figure 10B:
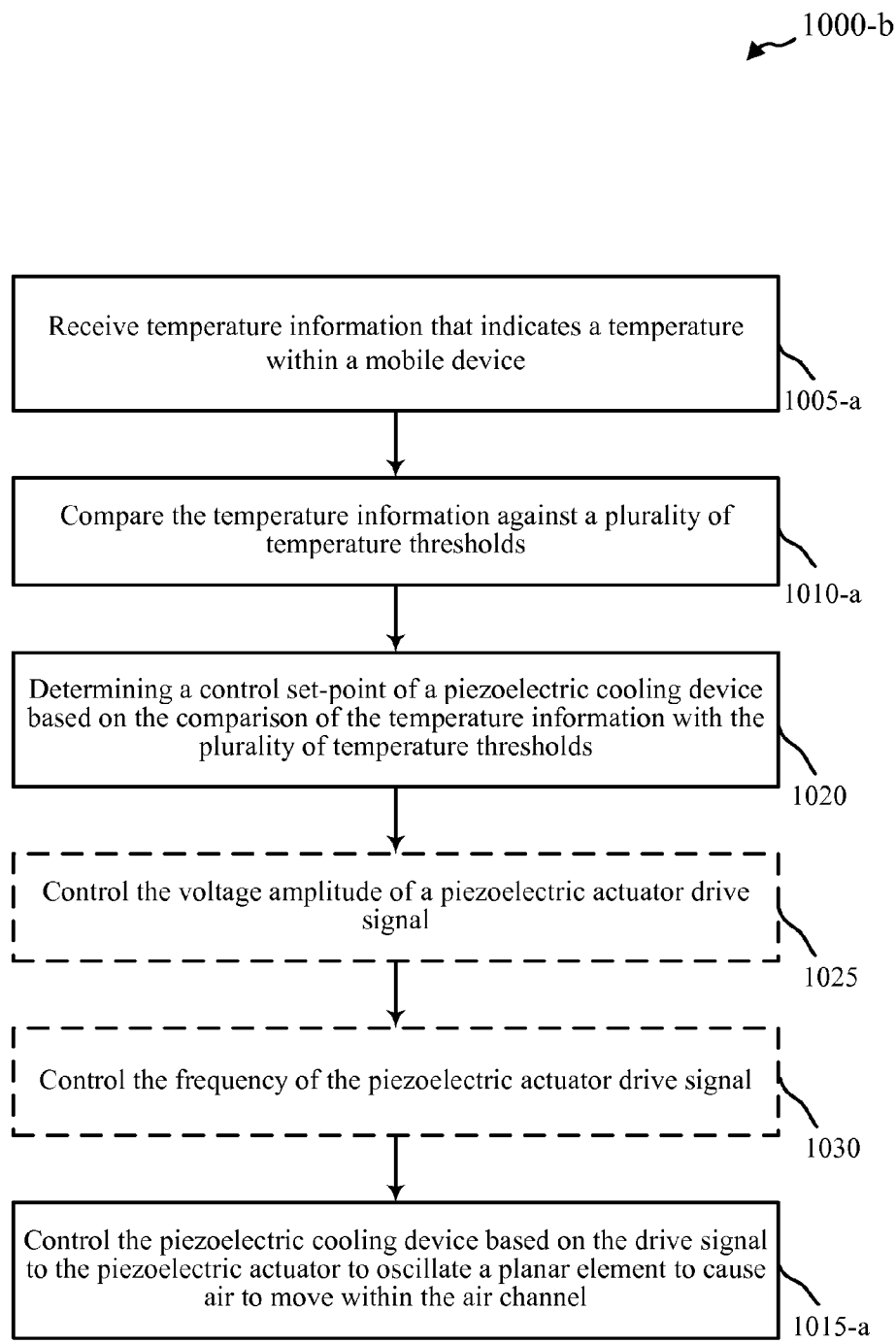
FIG. 10B shows a block diagram of a method for providing active cooling for a mobile computing device, according to various embodiments.

FIG. 10B shows a flow diagram of a method 1000-*b* for active cooling of a mobile device in accordance with various embodiments. Method 1000-*b* may be implemented utilizing various mobile devices such as mobile devices 500 and/or 700 as seen in FIG. 5 and/or FIG. 7, employing piezoelectric active cooling devices including, but not limited to, piezoelectric active cooling devices 120, 220, 320, 420, and/or 820 as seen in FIG. 1A, FIG. 1B, FIG. 2A, FIG. 2B, FIG. 2C, FIG. 3A, FIG. 3B, FIG. 3C, FIG. 4A, FIG. 4B, FIG. 4C, FIG. 8A, FIG. 8B, and/or FIG. 8C.

At block 1005 of method 1000-*b*, temperature information that indicates a temperature within a mobile device is received. The temperature information may indicate the temperature of a processor of the mobile device or other internal temperature of the mobile device such as the temperature of a heat dissipation surface of an air channel within the mobile device. For example, temperature information may be received in a processor of a mobile device such as processor module 930 of mobile device 900 from temperature sensor(s) 940.

At block 1010-*a* of method 1000-*b*, the temperature information is compared with a plurality of temperature thresholds. For example, the temperature information may be compared against a look-up-table of temperature thresholds At block 1020, a control set-point of a piezoelectric cooling device is determined based on the comparison of the temperature information with the plurality of temperature thresholds. For example, the control set-point of the piezoelectric cooling device may be determined from the look-up-table. The control set-point of the piezoelectric cooling device may represent an amount of desired cooling from the piezoelectric cooling device.

At block 1025, a voltage amplitude for a drive signal for a piezoelectric actuator of the piezoelectric cooling device may be determined from the control set-point of the piezoelectric cooling device. At block 1030 a frequency for the drive signal for the piezoelectric actuator of the piezoelectric cooling device may be determined from the control set-point of the piezoelectric cooling device. At block 1015-*a*, the piezoelectric actuator of the piezoelectric cooling device may be controlled according to the drive signal to oscillate a planar element to cause air to move within the mobile device.

It should be noted that the methods, systems and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Moreover, as disclosed herein, the term "memory" or "memory unit" may represent one or more devices for storing data, including read-only memory (ROM), random access memory (RAM), magnetic RAM, core memory, magnetic disk storage mediums, optical storage mediums, flash memory devices or other computer-readable mediums for storing information. The term "computer-readable medium" includes, but is not limited to, portable or fixed storage devices, optical storage devices, wireless channels, a sim card, other smart cards, and various other mediums capable of storing, containing or carrying instructions or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A mobile device, comprising:
   an air channel defined by at least a first heat dissipation surface; and
   a piezoelectric cooling device comprising:
      a planar element disposed at least partially within the air channel;
      a piezoelectric actuator coupled to the planar element at a first end of the planar element and configured to oscillate the first end of the planar element to cause a transverse wave in the planar element that travels from the first end to a second, distal end of the planar element; and
      a spring element coupled to the second end of the planar element, the spring element springedly attaching the second end of the planar element to the mobile device.

2. The mobile device of claim 1, wherein the piezoelectric actuator and the planar element comprise a piezoelectric bimorph actuator.

3. The mobile device of claim 1, wherein the mobile device further comprises:
   a first semiconductor package having a top surface that comprises the first heat dissipation surface; and
   a second semiconductor package having a bottom surface that comprises a second heat dissipation surface of the air channel, the second semiconductor package in a package on package (PoP) configuration with the first semiconductor package.

4. The mobile device of claim 3, wherein the air channel further comprises:
   an air inlet port on a housing of the mobile device; and
   an air outlet port on the housing of the mobile device.

5. The mobile device of claim 1, further comprising:
   an air outlet of the air channel, wherein the planar element is configured to fan air away from the first heat dissipation surface at the air outlet of the air channel.

6. The mobile device of claim 5, further comprising:
   an air inlet having upper and lower surfaces substantially parallel with the planar element and joined with the air channel at a side of the air channel adjacent to a lateral edge of the planar element.

7. The mobile device of claim 1, wherein the second end is arcuately shaped.

8. The mobile device of claim 1, wherein the piezoelectric actuator comprises a piezoelectric bimorph, a first end of the piezoelectric bimorph fixedly attached to the mobile device and a second end of the piezoelectric bimorph coupled to the first end of the planar element.

9. The mobile device of claim 1, further comprising:
   a temperature sensor; and
   a temperature controller coupled to the temperature sensor and the piezoelectric actuator, wherein the temperature controller controls the piezoelectric actuator to oscillate the first end of the planar element based on a measured temperature of the temperature sensor and a temperature threshold.

10. The mobile device of claim 9, wherein the temperature controller varies the amplitude of a drive signal to the piezoelectric actuator based on a measured temperature.

11. The mobile device of claim 1, wherein the air channel comprises:
    a first portion having a first dimension; and
    a second portion that tapers from the first dimension to a second larger dimension at an outlet port of the air channel.

12. The mobile device of claim 1, wherein the air channel comprises:
    a first portion having a first dimension; and
    a second portion that is arcuately shaped between the first dimension and a second larger dimension at an outlet port of the air channel, the second portion shaped to substantially match an extent of the planar element when oscillated.

13. A method for cooling a mobile device, the method comprising:
    disposing an air channel defined by at least a first heat dissipation surface within the mobile device;
    disposing a piezoelectric cooling device comprising a piezoelectric actuator and a planar element at least partially within the air channel;
    coupling the piezoelectric actuator to the planar element at a first end of the planar element; and
    controlling the piezoelectric actuator to oscillate the first end of the planar element to cause a transverse wave in the planar element that travels from the first end to a second, distal end of the planar element,
    wherein a spring element is coupled to the second end of the planar element, the spring element springedly attaching the second end of the planar element to the mobile device.

14. The method of claim 13, further comprising:
    measuring a temperature of the mobile device; and
    controlling the piezoelectric actuator based on the measured temperature.

15. A method for cooling a mobile device, the method comprising:
    receiving temperature information, the temperature information indicating temperature within the mobile device;
    comparing the temperature information against a temperature threshold;
    controlling, responsive to the comparing, a piezoelectric cooling device comprising a piezoelectric actuator coupled to a planar element to oscillate a first end of the planar element to cause a transverse wave in the planar element that travels from the first end to a second, distal end of the planar element; and
    wherein a spring element is coupled to the second end of the planar element, the spring element springedly attaching the second end of the planar element to the mobile device.

16. The method of claim 15, the piezoelectric actuator comprising a piezoelectric bimorph actuator.

17. The method of claim 15, the piezoelectric actuator and the planar element comprising a piezoelectric bimorph actuator.

18. The method of claim 15, wherein the temperature information indicates a temperature of a processor of the mobile device.

19. The method of claim 15, wherein the temperature information indicates a temperature of an air channel within the mobile device.

20. The method of claim 15, wherein the controlling comprises controlling an amplitude of a drive voltage to the piezoelectric actuator based on the comparing of the temperature information against the temperature threshold.

21. The method of claim 20, wherein the temperature threshold comprises a plurality of temperature thresholds and the comparing comprises determining a control set-point of the piezoelectric actuator based on the plurality of temperature thresholds.

22. A mobile device, comprising:
means for receiving temperature information, the temperature information indicating temperature within the mobile device;
means for comparing the temperature information against a temperature threshold; and
means for controlling, responsive to the comparing, a piezoelectric cooling device comprising a piezoelectric actuator coupled to a planar element to oscillate a first end of the planar element to cause a transverse wave in the planar element that travels from the first end to a second, distal end of the planar element,
wherein a spring element is coupled to the second end of the planar element, the spring element springedly attaching the second end of the planar element to the mobile device.

23. A mobile device comprising:
at least one processor configured to:
receive temperature information, the temperature information indicating temperature within the mobile device;
compare the temperature information against a temperature threshold; and
control, responsive to the comparison, a piezoelectric cooling device comprising a piezoelectric actuator coupled to a planar element to oscillate a first end of the planar element to cause a transverse wave in the planar element that travels from the first end to a second, distal end of the planar element,
wherein a spring element is coupled to the second end of the planar element, the spring element springedly attaching the second end of the planar element to the mobile device.

* * * * *